United States Patent [19]

Davidson

[11] Patent Number: 5,778,077
[45] Date of Patent: Jul. 7, 1998

[54] AUTOMATIC VOLUME ADJUSTING DEVICE AND METHOD

[76] Inventor: Dennis M. Davidson, 1915 Madison St., Muskegon, Mich. 49442

[21] Appl. No.: 711,610

[22] Filed: Sep. 10, 1996

Related U.S. Application Data

[60] Provisional application No. 60/003,688, Sep. 13, 1995.

[51] Int. Cl.⁶ .................................................... H03G 3/00
[52] U.S. Cl. ................ 381/57; 340/825.24; 340/825.25; 340/825.72; 348/632; 381/107
[58] Field of Search ................................ 381/98, 103, 57, 381/107, 108; 340/825.24, 825.25, 825.72; 348/632

[56] References Cited

U.S. PATENT DOCUMENTS

| | | |
|---|---|---|
| 4,571,622 | 2/1986 | Davidov et al. . |
| 4,591,915 | 5/1986 | Davidov et al. . |
| 4,611,344 | 9/1986 | Hayama et al. . |
| 4,623,887 | 11/1986 | Welles, III ................ 340/825.57 |
| 5,054,071 | 10/1991 | Bacon . |
| 5,128,987 | 7/1992 | McDonough et al. . |
| 5,172,358 | 12/1992 | Kimura ........................ 381/108 |
| 5,268,964 | 12/1993 | Watts . |
| 5,291,558 | 3/1994 | Ross . |
| 5,363,147 | 11/1994 | Joseph et al. . |
| 5,369,440 | 11/1994 | Sussman . |
| 5,386,428 | 1/1995 | Plunkett ........................ 381/103 |
| 5,444,783 | 8/1995 | Na . |

FOREIGN PATENT DOCUMENTS 2249888  5/1992  United Kingdom .

*Primary Examiner*—Forester W. Isen
*Attorney, Agent, or Firm*—Price, Heneveld, Cooper, DeWitt & Litton

[57] ABSTRACT

A method and device for automatically adjusting the volume of an existing audio device such as a television and/or stereo receiver. The automatic volume adjusting device of the present invention includes a receiver for receiving control signals transmitted from a remote control transmitter associated with the audio device, a transmitter for transmitting control signals to a control signal receiver of the audio device, a microphone for sensing an ambient noise level, and a controller coupled to the receiver, to the transmitter, and to the microphone. The controller operates in a training mode and an operating mode. In the training mode, the controller learns codes associated with volume adjusting control signals transmitted by the remote control transmitter. In the operating mode, the controller determines when the ambient level of noise detected by the microphone is outside a predefined volume range and adjusts the volume of the remotely controlled audio device to fall within the predefined range by transmitting the learned control signals to the audio device. The automatic volume adjusting device may further include a push-button toggle switch and an indicator light, such as a light emitting diode (LED) for placing the controller in a training or operating mode and a power converter for converting power supplied from a 110-volt AC wall outlet to a DC voltage for internal use within the device.

16 Claims, 4 Drawing Sheets

AUTOMATIC VOLUME ADJUSTING DEVICE AND METHOD

CROSS-REFERENCE TO RELATED APPLICATIONS

This application claims priority under 35 U.S.C. §119(e) on U.S. Provisional application No. 60/003,688 entitled AUTOMATIC VOLUME ADJUSTING DEVICE, filed on Sep. 13, 1995, by Dennis M. Davidson, the entire disclosure of which is herein incorporated by reference.

BACKGROUND OF THE INVENTION

The present invention relates to a device for automatically adjusting the volume of another device, and more particularly to a device for automatically adjusting the volume of a television or stereo having a volume that may be adjusted through the operation of a wireless remote control.

The relatively recent marriage of stereo sound and television has drastically improved the quality of television audio. However, many television commercials are purposely recorded at extremely high audio levels relative to the audio levels of the television programs to attract the attention of the individuals watching the television programs. Many television viewers find the increased noise levels of the commercials to be very annoying. Although stereo broadcasts have increased the dynamic range of the program audio, they exacerbate the problem of noisy commercials. Thus, these disgruntled viewers constantly have to resort to lowering the volume during commercials and raising the volume when the programs resume. Alternatively, the viewer must listen to the program at a lower volume level than otherwise desired.

Currently televisions exist, such as those produced by Magnavox, that include circuitry for automatically adjusting their volume in order to limit the volume of commercials that are broadcast at a much higher volume than the program being watched. The volume adjusting circuitry in these televisions is internal to the television set, and therefore, unless an individual purchases one of these particular televisions, the individual must manually adjust the volume of the television or stereo in order to maintain the volume within desired limits. Because the audio signal level is detected in such televisions at the output of the internal tuner, the volume adjusting circuitry is necessarily also internal to the television. Presently, no after-market product exists for automatically adjusting the volume of a previously purchased television set or stereo to ameliorate the problems associated with the broadcast of television commercials at loud noise levels.

SUMMARY OF THE INVENTION

The present invention is particularly designed and adapted to solve the above-noted problems by providing a device, which may be purchased separately from a television or stereo, for automatically adjusting the volume of the television or stereo. It is another aspect of the present invention to provide an automatic volume adjusting device that is operable to adjust the volume of any television or stereo having an infrared (IR) receiver for receiving volume adjusting signals from an associated remote control transmitter. Yet another aspect of the present invention is to provide an automatic volume adjusting device that operates responsively to IR signals transmitted from the remote control transmitter associated with the television or stereo with which the volume adjusting device of the present invention interacts.

To achieve these and other aspects, features, and advantages, the automatic volume adjusting device of the present invention includes a receiver for receiving control signals transmitted from a remote control transmitter associated with the audio device, a transmitter for transmitting control signals to a control signal receiver of the audio device, a microphone for sensing an ambient noise level, and a controller coupled to the receiver, to the transmitter, and to the microphone. The controller operates in a training mode and an operating mode. The controller learns codes associated with volume adjusting control signals transmitted by the remote control transmitter when in the training mode, and determines when the ambient level of noise detected by the microphone is outside a predefined volume range and adjusting the volume of the remotely controlled audio device to fall within the predefined range by transmitting the learned control signals to the audio device when the controller is in the operating mode. The automatic volume adjusting device may further include a push-button toggle switch and an indicator light, such as a light emitting diode (LED) for placing the controller in a training or operating mode and a power converter for converting power supplied from a 110-volt AC wall outlet to a DC voltage for internal use within the device.

These and other features, objects, and benefits of the invention will be recognized by those who practice the invention and by those skilled in the art, from reading the following specification and claims together with reference to the accompanying drawing figures.

DETAILED DESCRIPTION OF THE PREFERRED EMBODIMENTS

Figure 1:
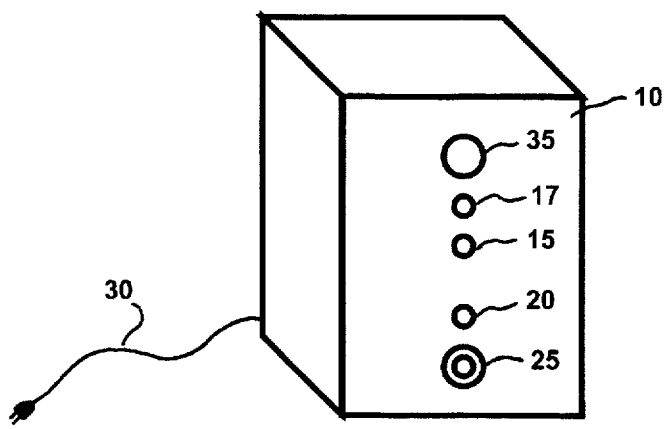
FIG. 1 is a perspective view of the automatic volume adjusting device constructed in accordance with the present invention.
Figure 2:
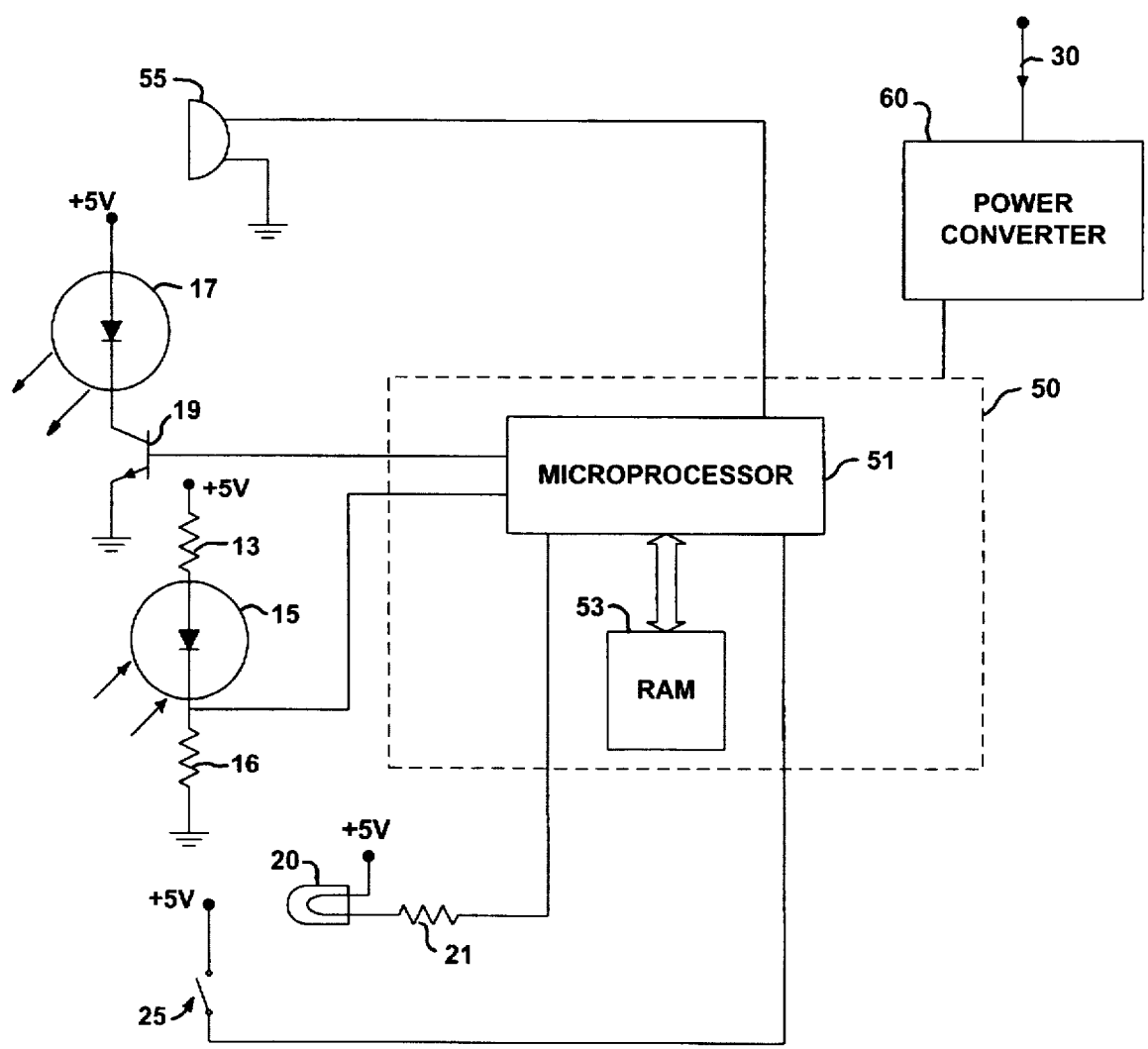
FIG. 2 is an electrical diagram in schematic and block form of the electrical circuitry of the present invention.

FIG. 1 shows the automatic volume adjusting device 5 of the present invention, which includes a housing 10 for mounting an IR receiver 15, an IR transmitter 17, an indicator light 20, a toggle switch 25, an electric cord 30, a microphone grill 35 for protecting a microphone 55 (FIG. 2), and an electronic circuit 50 (shown in FIG. 2). The housing 10 may be of any size or shape and may be located anywhere in the room in which the television or stereo receiver whose volume the device is to automatically adjust, is located.

Because IR signals reflect off walls of the room, the device need only be positioned such that any IR signal transmitted from the device may be received by the IR receiver of the television or stereo and is preferably positioned such that any IR signal transmitted from the remote control associated with the television or receiver may be received by the IR receiver 15 disposed on housing 10. Further, the device preferably should be located where the microphone of the device may sense an ambient noise level that is substantially the same as that heard by those individuals listening to the television or receiver.

The electronic circuit contained within the housing 10 is shown in FIG. 2 and includes a control circuit 50 including a microprocessor 51 and a random access memory (RAM) 53 coupled to microprocessor 51, a microphone 55 mounted to the housing behind microphone grill 35 and coupled to microprocessor 51, and a power converter 60 coupled to control circuit 50. Microprocessor 51 is coupled to IR receiver 15, IR transmitter 17, indicator light 20, and toggle switch 25. Control circuit 50, IR receiver 15, and IR transmitter 17 may be implemented using any conventional circuit for learning the code of a received IR signal and transmitting an IR signal having the learned code. Such conventional circuits are used in universal (trainable) IR remote control devices commonly used to manually control televisions and stereo receivers. An example of such a conventional circuit is disclosed in U.S. Pat. No. 4,623,887, the disclosure of which is incorporated herein by reference.

Power converter 60, which is connected to cord 30 to receive household AC power from a conventional AC power outlet, converts the received AC power to a DC power level suitable for use by control circuit 20. IR receiver 15 may be any conventional photodiode and typically has its anode coupled to +5 V through a resistor 13 and its cathode coupled to ground through another resistor 16. IR transmitter 17 may be any conventional IR LED and preferably has its anode coupled to +5 V and its cathode selectively coupled to ground via a transistor 19 having its base coupled to microprocessor 51. Having described the structure of the present invention, the detailed operation is described below with respect to the control program described with respect to FIGS. 6 and 7.

An individual may turn on the automatic volume adjusting device by pressing toggle switch 25 once or by pressing a separate ON/OFF switch if one is provided. When microprocessor 51 senses a high voltage (+5 V) at its terminal associated with toggle switch 25, it executes control program 100, which is described in more detail below, and illuminates indicator light 20, which may be an LED. When the device is turned on, microprocessor 51 monitors the output of photodiode 15 to determine whether an IR TV ON/OFF command has been received (step 102). If such a command has not been received, microprocessor 51 then checks its input port associated with toggle switch 25 to determine whether toggle switch 25 has been pressed (step 104). If toggle switch 25 has not been pressed, microprocessor 51 loops back to step 102 until either a TV ON/OFF command is received or toggle switch 25 is pressed. If toggle switch 25 has been pressed, microprocessor 51 executes training routine 106, which is described below with reference to FIG. 7.

Figure 3:
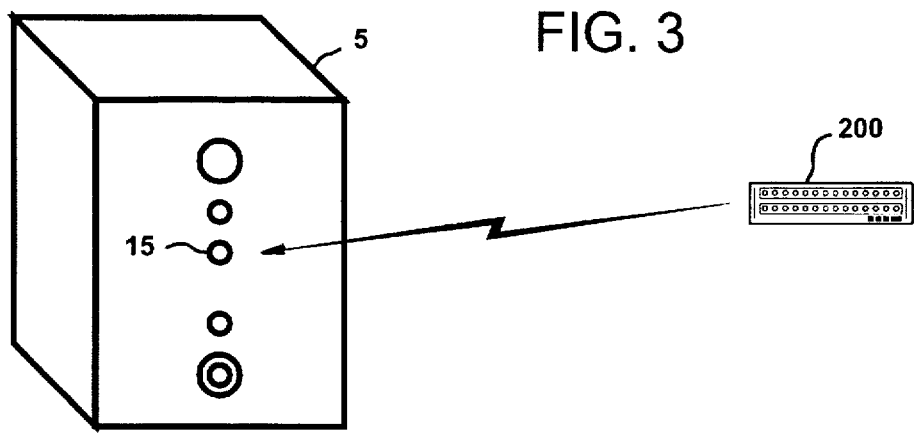
FIG. 3 is a perspective view of the automatic volume adjusting device of the present invention when receiving infrared signals from a remote control transmitter during a training routine.

Prior to full operation, the automatic volume adjusting device should be trained so as to learn the codes transmitted by the remote control transmitter that the television or stereo will recognize as a VOLUME UP or VOLUME DOWN command. To train the automatic volume adjusting device, the individual presses toggle switch 20 twice to learn the VOLUME UP code and three times to learn the VOLUME DOWN code. Upon sensing that toggle switch has been pressed twice (step 108) within a predetermined time period, microprocessor 51 causes indicator light 20 to flash in step 110 to prompt the user to press the VOLUME UP button on the remote control transmitter 200 (FIG. 3). Microprocessor 51 continues to flash indicator light 20 until a signal is detected. Once the indicator light is flashing, the individual training the device presses the VOLUME UP button on remote control transmitter 200 causing it to transmit an IR signal including the code that the television or stereo will recognize as a VOLUME UP command. This transmitted IR signal is received by IR receiver 15 and processed by control circuit 50 such that microprocessor 51 may identify the code and modulation scheme and store the identified code and modulation scheme in RAM 53 at a location reserved for a VOLUME UP code (step 114).

Similarly, if toggle switch 25 is pressed three times within a predetermined time period, microprocessor 51 causes indicator light 20 to flash (step 118) to prompt the user to press the VOLUME DOWN button on the remote control transmitter 200. Once the indicator light is flashing, the individual training the device presses the VOLUME DOWN button on remote control transmitter 200 causing it to transmit an IR signal including the code that the television or stereo will recognize as a VOLUME DOWN command. This transmitted IR signal is received by IR receiver 15 (step 120) and processed by control circuit 50 such that microprocessor 51 may identify the code and modulation scheme and store the identified code and modulation scheme in RAM 53 at a location reserved for a VOLUME DOWN code (step 122).

Figure 6:
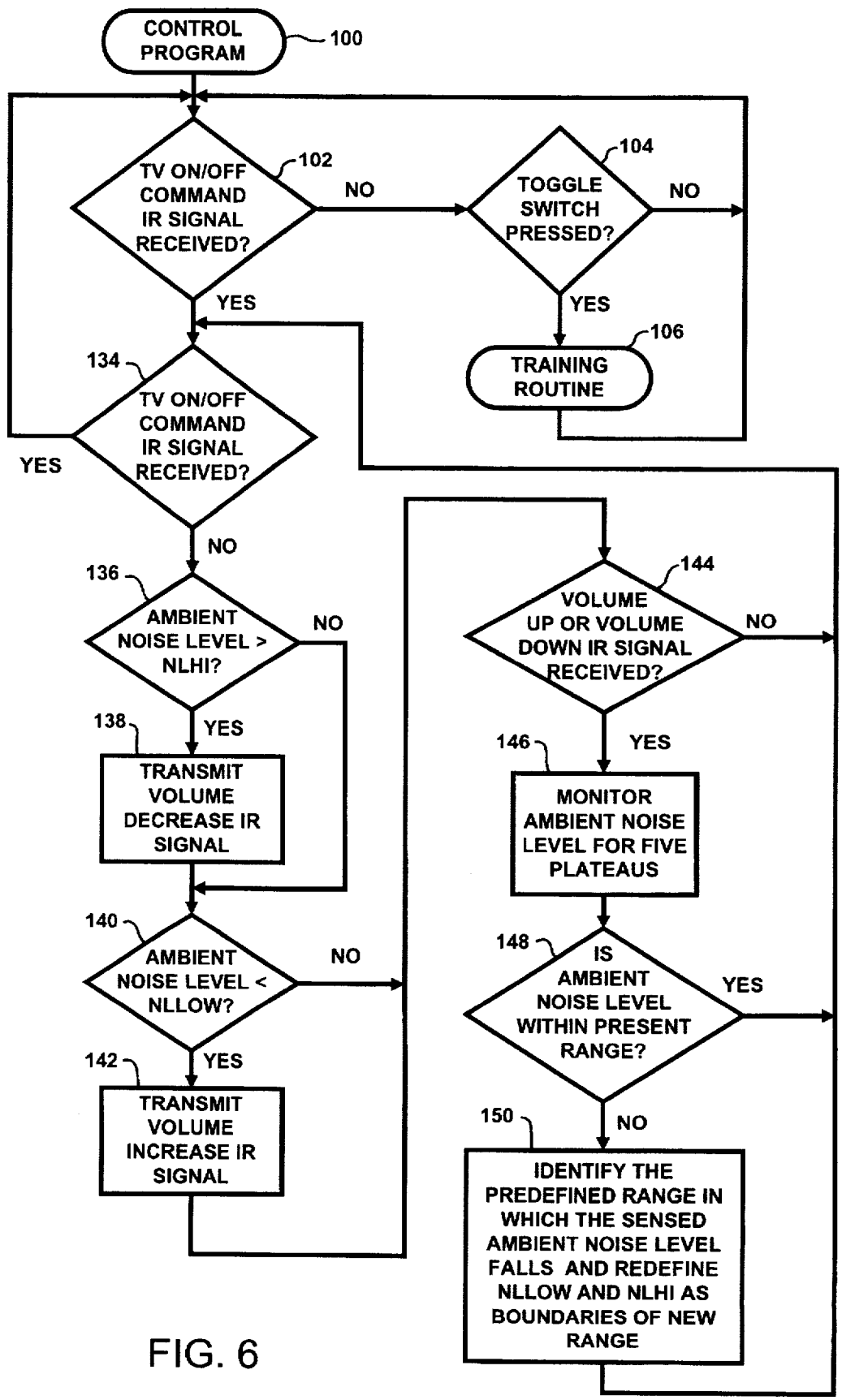
FIG. 6 is a flow diagram illustrating the control program executed by the microprocessor shown in FIG. 2.
Figure 7:
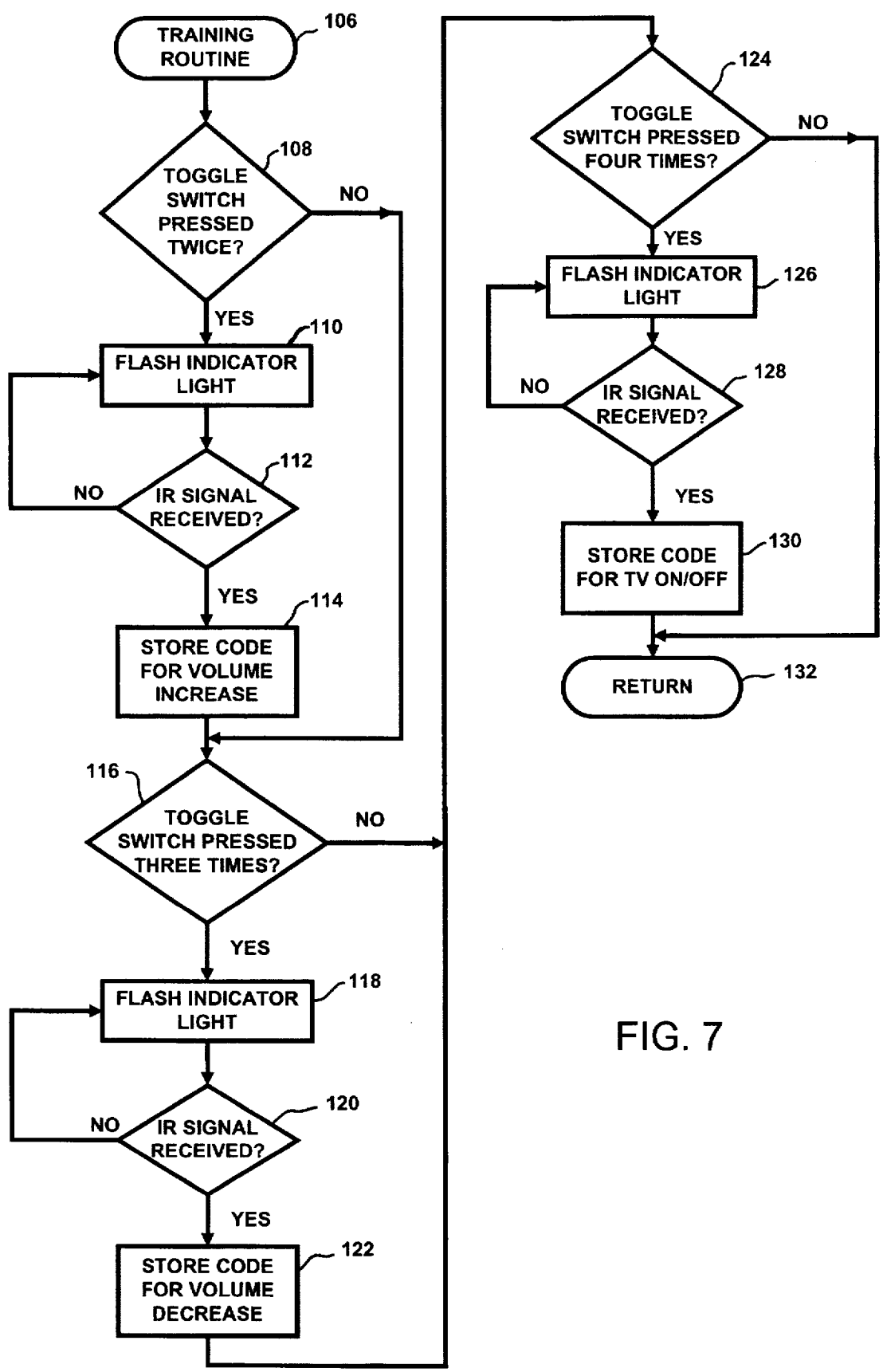
FIG. 7 is a flow diagram illustrating the training routine executed by the microprocessor shown in FIG. 2.

The automatic volume adjusting device may also be trained in the same manner to the ON/OFF codes for turning on and off the television or stereo. If, in step 124, microprocessor 51 determines that toggle switch 25 has been pressed four times within a predetermined time period, it causes indicator light 20 to flash (step 126) until an IR signal is received (step 128). When an IR signal is received, microprocessor 51 identifies the code and stores the learned code in RAM 53 at a location reserved for a TV ON/OFF command (step 130). After the training routine is finished, microprocessor 51 returns (step 132) to step 102 of the main control program 100 (FIG. 6).

After the device has been properly trained, it can respond to the receipt of a TV ON/OFF command signal by toggling between ON and OFF states. When a TV ON/OFF command signal is received, microprocessor 51 detects this in step 102 and proceeds to step 134 in which microprocessor 51 checks whether a subsequent TV ON/OFF command IR signal has been received. If a subsequent TV ON/OFF command signal is received meaning that the television or stereo has been turned off, microprocessor 51 returns to step 102 until another TV ON/OFF command signal is received. If no subsequent TV ON/OFF command signal is received meaning that the television or stereo remains on, the device will monitor the ambient noise level in the room and automatically adjust the volume of the television or stereo. The device is designed to adjust the volume of the television or stereo when it is in the operating mode, such that the sensed volume will not exceed or fall below limits selected by the user. Thus, this device will automatically reduce the volume of a television when a loud commercial comes on and will automatically increase the volume after the commercial is over. Also, this device will adjust the television volume such that it remains at a substantially constant level when the television channels are changed between two channels broadcasting at different volume levels.

Figure 4:
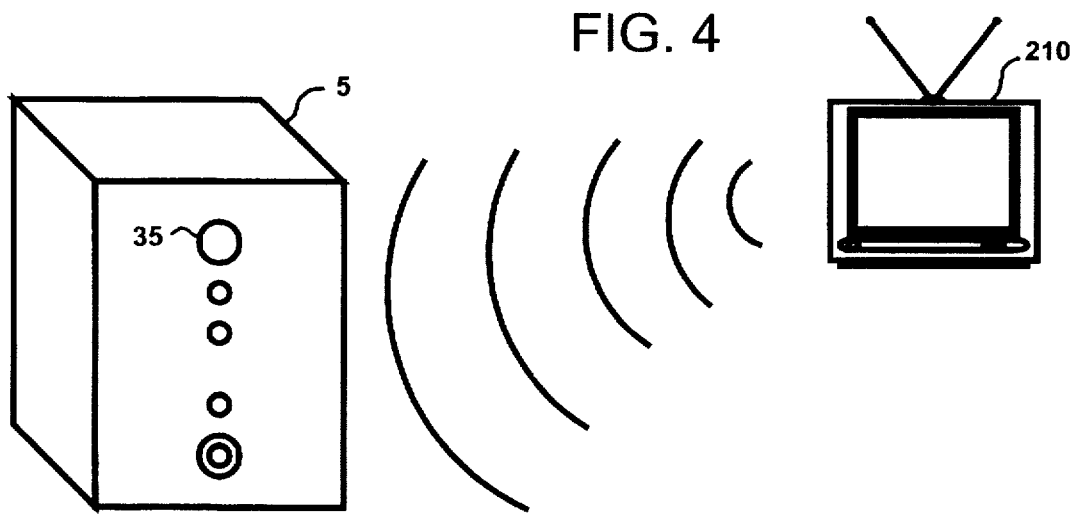
FIG. 4 is a perspective view of the automatic volume adjusting device of the present invention when detecting ambient noise levels including the noise levels of a television.
Figure 5:
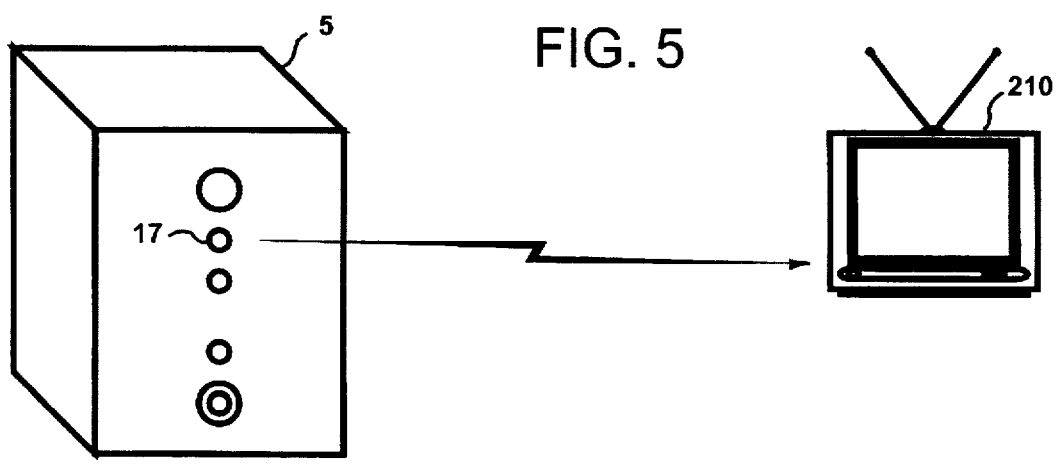
FIG. 5 is a perspective view of the automatic volume adjusting device of the present invention when transmitting an infrared signal having the learned characteristics to a television in order to control the volume of the television.

The device 5 monitors the level of ambient sound produced by the television 210 (FIG. 4) or stereo speakers using microphone 55 and adjusts the volume level of the television 210 or stereo by transmitting an IR signal to the IR receiver 215 of the television 210 or stereo (FIG. 5). The transmitted IR signal includes the learned code and modulation scheme that the television 210 or stereo will recognize as a VOLUME UP or VOLUME DOWN command from its associated remote control transmitter.

When the device is initially placed in the operating mode, a signal representing the ambient noise level is generated by microphone 55 and supplied to microprocessor 51. Microprocessor 51 monitors the level of five "plateaus" (flat portions in the signal supplied from microphone 55) and determines the ambient noise level after five plateaus have been detected. Microprocessor 51 then determines which one of many predefined, mutually exclusive volume ranges the ambient noise level falls within. After the predefined range is identified, microprocessor 51 monitors the ambient noise level sensed by microphone 55 and determines whether the sensed level exceeds or falls below the limits of the identified predefined range. If the sensed level exceeds the upper limit NLHI of the identified predefined range for five consecutive plateaus (step 136), microprocessor 51 controls IR transmitter 17 to transmit a VOLUME DOWN IR signal to the television or stereo (step 138). If the sensed level falls below the lower limit NLLOW of the identified predefined range (step 140), microprocessor 51 controls IR transmitter 17 to transmit a VOLUME UP IR signal to the television or stereo (step 142).

If the user subsequently uses the remote control transmitter to turn the volume up or down, the device senses the transmitted IR signal (step 144) and monitors the level of five plateaus (step 146) in order to determine whether a different one of the predefined volume level ranges should be selected to maintain the volume level within a range surrounding the volume level selected by the user (step 148). If the sensed ambient noise level is not within the presently selected range, microprocessor 51 identifies the plurality of predefined mutually exclusive volume ranges in which the sensed volume level falls and redefines NLLOW and NLHI as the limits of the identified predefined range (step 150).

Microprocessor 51 responds to the detection of five plateaus in the signal supplied by microphone 55 rather than to peaks because the sound produced by the television or stereo is relatively flat compared with other noises within a room (such as a closing door) that may contribute to the ambient noise level. The device may raise or lower the volume to remain within the specified allowable volume range by transmitting a VOLUME UP or VOLUME DOWN signal for a very brief period while subsequently monitoring the ambient noise level to determine whether subsequent transmissions of the VOLUME UP or VOLUME DOWN commands are needed to bring the ambient noise level within the specified range. Alternatively, microprocessor 51 may be programmed to detect the difference between the noise thresholds established for the specified range and the detected ambient noise level, and then to assign a corresponding value to a loop variable. Microprocessor 51 would then transmit the VOLUME UP or VOLUME DOWN command for a variable length of time determined by the loop variable. In this manner, the volume may be adjusted in one pass through the control program operational loop.

Although the present invention has been described above as selecting one of a plurality of predefined mutually exclusive volume ranges to establish upper and lower volume thresholds, it will be appreciated by those skilled in the art that such thresholds could be established by adding a predetermined off-set dB level to the sensed volume level to establish the upper threshold while subtracting this same off-set from the sensed level to establish the lower threshold level. Further, the operating control program of microprocessor 51 may be modified such that the volume is reset to its last level thirty seconds, which corresponds to the length of an average commercial, after a VOLUME DOWN signal has been transmitted by device 5 as a result of a detection of an ambient noise level above the upper threshold. In this manner, if a subsequent commercial is not sufficiently loud to cause a volume adjustment, or if the program has resumed following a loud commercial, the volume adjusting device would reset the volume of the television or stereo receiver to the volume level established before the commercial interruptions.

The above description is considered that of the preferred embodiments only. Modifications of the invention will occur to those skilled in the art and to those who make or use the invention. For example, a multi-position switch may be provided in lieu of the toggle switch such that microprocessor 51 detects the position of the switch rather than the number of times the toggle switch has been pressed during the training routine. Therefore, it is understood that the embodiments shown in the drawings and described above are merely for illustrative purposes and are not intended to limit the scope of the invention, which is defined by the following claims as interpreted according to the principles of patent law, including the Doctrine of Equivalents.

The embodiments of the invention in which an exclusive property or privilege is claimed are defined as follows:

1. An automatic volume adjusting device for adjusting the volume of a remotely controlled audio device, said automatic volume adjusting device comprising:

a receiver for receiving control signals transmitted from a remote control transmitter associated with the audio device both during a training mode and an operational mode, a transmitter for transmitting control signals to a control signal receiver of the audio device;

a microphone for continuously sensing an ambient noise level including any sounds simultaneously produced by any speakers connected to the controlled audio device during normal operation of the controlled audio device; and a controller coupled to said receiver, to said transmitter, and to said microphone, said controller being operative in a training mode and an operating mode for learning codes associated with main volume adjusting control signals transmitted by the remote control transmitter when in the training mode, and for determining when the ambient level of noise detected by said microphone is outside a predefined volume range and adjusting the main volume of the remotely controlled audio device to fall within the predefined range by transmitting the learned control signals to the audio device when said controller is in the operating mode.

2. The automatic volume adjusting device as defined in claim 1, wherein said receiver is an infrared receiver and the control signals received thereby from the remote control transmitter associated with the audio device are infrared signals, and wherein said transmitter is an infrared transmitter for transmitting infrared control signals to the audio device.

3. The automatic volume adjusting device as defined in claim 1, wherein said controller includes a memory device for storing the learned codes of received control signals.

4. The automatic volume adjusting device as defined in claim 3, wherein said memory device further stores a plurality of predefined volume ranges and wherein said controller selects one of said predefined volume ranges based upon an initially sensed ambient noise level.

5. The automatic volume adjusting device as defined in claim 4, wherein said predefined volume ranges are mutually exclusive.

6. The automatic volume adjusting device as defined in claim 1, wherein, when in the training mode, said controller learns the code associated with an ON/OFF control signal transmitted by the remote control transmitter, and when in the operating mode, said controller monitors the output of said receiver to determine whether the learned ON/OFF control signal has been received and begins to monitor the sensed ambient noise level when an ON/OFF control signal has been received.

7. The automatic volume adjusting device as defined in claim 13, wherein, when in the operating mode, said controller toggles between an ON state and an OFF state in response to a received ON/OFF control signal, and wherein said controller monitors the sensed ambient noise level when in the ON state.

8. The automatic volume adjusting device as defined in claim 1 and further including a user-actuated switch coupled to said controller, wherein said controller responds to an actuation of said switch to enter the training mode.

9. The automatic volume adjusting device as defined in claim 8, wherein said switch is a toggle switch.

10. The automatic volume adjusting device as defined in claim 8, wherein said controller is responsive to the actuation of said switch to prompt a user to transmit a VOLUME DOWN control signal from the remote control transmitter associated with the audio device, to receive and learn the code of the VOLUME DOWN control signal.

11. The automatic volume adjusting device as defined in claim 8, wherein said controller is responsive to the actuation of said switch to prompt a user to transmit a VOLUME UP control signal from the remote control transmitter associated with the audio device, to receive and learn the code of the VOLUME UP control signal.

12. The automatic volume adjusting device as defined in claim 8, wherein said controller is responsive to the actuation of said switch to prompt a user to transmit an ON/OFF control signal from the remote control transmitter associated with the audio device, to receive and learn the code of the ON/OFF control signal.

13. A method for automatically adjusting the main volume of a remotely controlled audio device, said method comprising the steps of:

receiving a VOLUME DOWN control signal transmitted from a remote control transmitter associated with the audio device;

learning the characteristics of the received VOLUME DOWN control signal;

storing data representing the learned characteristics;

continuously sensing an ambient noise level including any sound simultaneously produced by any speakers connected to the controlled audio device during normal operation of the controlled audio device; and reading the data representing the learned characteristics of the VOLUME DOWN control signal and transmitting a VOLUME DOWN control signal to the audio device when the ambient noise level exceeds an upper threshold noise level.

14. A method for automatically adjusting the main volume of a remotely controlled audio device, said method comprising the steps of:

receiving a VOLUME UP control signal transmitted from a remote control transmitter associated with the audio device;

learning the characteristics of the received VOLUME UP control signal;

storing data representing the learned characteristics;

continuously sensing an ambient noise level including any sound simultaneously produced by any speakers connected to the controlled audio device during normal operation of the controlled audio device; and reading the data representing the learned characteristics of the VOLUME UP control signal and transmitting a VOLUME UP control signal to the audio device when the ambient noise level falls below a lower threshold noise level.

15. An automatic volume adjusting device for adjusting the volume of a remotely controlled audio device, said automatic volume adjusting device comprising:

an IR receiver for receiving VOLUME UP and VOLUME DOWN IR control signals transmitted from a remote control transmitter associated with the audio device;

identification means coupled to said IR receiver for identifying the characteristics of the received VOLUME UP and VOLUME DOWN control signals and for generating control data representing the learned characteristics;

a memory coupled to said identification means, for storing the control data and a plurality of predefined allowable volume ranges;

a microphone for continuously sensing an ambient noise level including any sound simultaneously produced by any speakers connected to the controlled audio device during normal operation of the controlled audio device;

comparing means, coupled to said memory and to said microphone for selecting one of said predefined allowable volume ranges based upon an initially sensed ambient noise level, for comparing the ambient noise level sensed by said microphone to upper and lower threshold levels defined by the selected allowable volume range, for reading the data from said memory that corresponds to the learned VOLUME DOWN control signal when the sensed ambient noise level exceeds the upper threshold level, and for reading the data from said memory that corresponds to the learned VOLUME UP control signal when the sensed ambient noise level falls below the lower threshold level when in an operating mode; and an IR transmitter coupled to said comparing means, for transmitting a VOLUME DOWN control signal to the audio device when said comparing means determines that the sensed ambient noise level exceeds the upper threshold level, and for transmitting a VOLUME UP control signal when said comparing means determines that the sensed ambient noise level is below the lower threshold level, wherein, in the operating mode, said comparing means selects a different one of said predefined allowable volume ranges when said receiver receives a VOLUME UP or a VOLUME DOWN control signal and when said controller determines that a subsequently sensed ambient noise level is no longer within the previously selected predefined allowable volume range.

16. An automatic volume adjusting device for adjusting the volume of a remotely controlled audio device, said automatic volume adjusting device comprising:

a receiver for receiving control signals transmitted from a remote control transmitter associated with the audio device;

a transmitter for transmitting control signals to a control signal receiver of the audio device;

a microphone for sensing an ambient noise level; and a controller coupled to said receiver, to said transmitter, and to said microphone, said controller being operative in a training mode and an operating mode for learning codes associated with volume adjusting control signals transmitted by the remote control transmitter when in the training mode, and for determining when the ambient level of noise detected by said microphone is outside a predefined volume range and adjusting the volume of the remotely controlled audio device to fall within the predefined range by transmitting the learned control signals to the audio device when said controller is in the operating mode, wherein said controller includes a memory device for storing the learned codes of received control signals, said memory device further stores a plurality of predefined volume ranges and wherein said controller selects one of said predefined volume ranges based upon an initially sensed ambient noise level, wherein, in the operating mode, said controller selects a different one of said predefined volume ranges when said receiver receives a VOLUME UP or a VOLUME DOWN control signal and when said controller determines that a subsequently sensed ambient noise level is no longer within the previously selected predefined volume range.

* * * * *

UNITED STATES PATENT AND TRADEMARK OFFICE
CERTIFICATE OF CORRECTION

PATENT NO.    : 5,778,077
DATED         : July 7, 1998
INVENTOR(S)   : Dennis M. Davidson It is certified that error appears in the above-identified patent and that said Letters Patent is hereby corrected as shown below:

Column 5, line 42, "predefmed" should be --predefined--.

Column 7, line 17, "defmed" should be --defined--.

Column 7, line 18, "claim 13" should be --claim 6--.

Signed and Sealed this

Nineteenth Day of January, 1999

Attest:

Attesting Officer

*Acting Commissioner of Patents and Trademarks*